(12) United States Patent
Raghuram

(10) Patent No.: US 7,266,639 B2
(45) Date of Patent: Sep. 4, 2007

(54) MEMORY RANK DECODER FOR A MULTI-RANK DUAL INLINE MEMORY MODULE (DIMM)

(75) Inventor: Siva Raghuram, Germering (DE)

(73) Assignee: Infineon Technologies AG, Munich (DE)

( * ) Notice: Subject to any disclaimer, the term of this patent is extended or adjusted under 35 U.S.C. 154(b) by 206 days.

(21) Appl. No.: 11/010,182

(22) Filed: Dec. 10, 2004

(65) Prior Publication Data
US 2006/0129755 A1 Jun. 15, 2006

(51) Int. Cl.
*G06F 12/00* (2006.01)
*G11C 8/06* (2006.01)
*G11C 8/12* (2006.01)

(52) U.S. Cl. .................. 711/115; 711/105; 365/230.08

(58) Field of Classification Search ................ 711/115, 711/105
See application file for complete search history.

(56) References Cited

U.S. PATENT DOCUMENTS 5,332,922 A * 7/1994 Oguchi et al. ............. 257/723
6,502,161 B1 * 12/2002 Perego et al. .................. 711/5
6,683,372 B1 * 1/2004 Wong et al. ................ 257/686
7,200,021 B2 * 4/2007 Raghuram .................... 365/51
2002/0112119 A1 * 8/2002 Halbert et al. ............. 711/115

OTHER PUBLICATIONS

Natarajan et al., "A Study of Performance Impact of Memory Controller Features in Multi-Processor Server Environment", ACM International Conference Proceedings Series, vol. 68, Proceedings of the 3rd Workshop on Memory Performance Issues: in Conjuction with the 31st International Symposium on Computer Architecture, pp. 80-87, ACM Press, Jun. 2004.*

* cited by examiner

*Primary Examiner*—Reginald Bragdon
*Assistant Examiner*—Tyler Willhite
(74) *Attorney, Agent, or Firm*—Jenkins, Wilson, Taylor & Hunt, P.A.

(57) ABSTRACT

The invention refers to a Memory Rank Decoder for a Multi-Rank Dual Inline Memory Module (DIMM) having a predetermined number of DRAM memory chips mounted on a printer circuit board (PCB), wherein each DRAM memory chip comprises a predetermined number of stacked DRAM memory dies which are selectable by a memory rank selection signal (r), wherein the memory rank decoder generates the memory rank selection signal (r) in response to external selection signals applied to the dual inline module (DIMM).

11 Claims, 6 Drawing Sheets first embodiment

| Rank Selected | S0 | S1 | S2 |
|---|---|---|---|
| Rank0 | 0 | 0 | 0 |
| Rank1 | 1 | 0 | 0 |
| Rank2 | 0 | 1 | 0 |
| Rank3 | 1 | 1 | 0 |
| Rank4 | 0 | 0 | 1 |
| Rank5 | 1 | 0 | 1 |
| Rank6 | 0 | 1 | 1 |
| Rank7 | 1 | 1 | 1 |

MEMORY RANK DECODER FOR A MULTI-RANK DUAL INLINE MEMORY MODULE (DIMM)

TECHNICAL FIELD

The invention relates in general to a Memory Rank Decoder for a Multi-Rank Dual Inline Memory Module (DIMM) and in particular to a Memory Rank Decoder for a registered Dual Inline Memory Module (DIMM).

BACKGROUND ART

Memory modules are provided for increasing the memory capacity of a computer system. Originally single inline memory modules (SIMM) were used in personal computers to increase the memory size. A single inline memory module comprises DRAM chips on its printed circuit board (PCB) only on one side. The contacts for connecting the printed circuit board of the single inline memory module (SIMM) are redundant on both sides of the module. A first variant of SIMMs has thirty pins and provides 8 bits of data (9 bits in parity versions). A second variant of SIMMs which are called PS/2 comprise 72 pins and provide 32 bits of data (36 bits in parity versions).

Due to the different data bus width of the memory module in some processors, sometimes several SIMM modules are installed in pairs to fill a memory bank. For instance, in 80386 or 80486 systems having a data bus width of 32 bits either four 30 pins SIMMs or one 72 pin SIMM are required for one memory bank. For pentium systems having a data bus width of 64 bits two 72 pin SIMMs are required. To install a single inline memory module (SIMM) the module is placed in a socket. The RAM technologies used by single inline memory modules include EDO and FPM.

Dual Inline Memory Modules (DIMM) began to replace single inline memory modules (SIMM) as the predominant type of memory modules when Intels pentium processors became wide spread on the market.

While single inline memory modules (SIMMS) have memory units or DRAM chips mounted only on one side of their printed circuit boards (PCB) a dual inline memory modules (DIMMS) comprise memory units mounted on both sides of the printed circuit boards of the modules.

There are different types of Dual Inline Memory Modules (DIMM). An unbuffered Dual Inline Memory Module does not contain buffers or registers located on the module. These unbuffered Dual Inline Memory Modules are typically used in desktop PC systems and workstations. The number of pins are typically 168 in single data rate (SDR) memory modules, 184 pins in double data rate modules and in DDR-2 modules. DDR-2-DRAMs are a natural extension of the existing DDR-DRAMs. DDR-2 has been introduced at an operation frequency of 200 MHz and is going to be extended to 266 MHz (DDR-2 533), 333 MHz (DDR-2 667) for the main memory and even 400 MHz (DDR-2 800) for special applications. DDR-SDRAM (synchronous DRAMs) increase speed by reading data on both the rising edge and the falling edge of a clock pulse, essentially doubling the data bandwidth without increasing the clock frequency of a clock signal.

A further type of Dual Inline Memory Module (DIMM) is a registered Dual Inline Memory Module. A registered Dual Inline Memory Module comprises several additional circuits on the module in particular a redriver buffer component like a register to redrive command address signals. Further a phase locked loop (PLL) is provided for timing alignments to redrive clock signals. Registered Dual Inline Memory Modules are typically used in highend servers and highend workstations.

ECC- Dual Inline Memory Modules comprise error correction bits or ECC bits. This type of Dual Inline Memory Module has a total of 64 data bits plus 8 ECC bits and is used mostly for server computers. Registered Dual Inline Memory Modules either with ECC or without ECC are used for SDR, DDR and DDR-2.

A further type of Dual Inline Memory Modules are so called small outline DIMM (SO-DIMM). They are an enhanced version of standard Dual Inline Memory Modules and are used in laptops and in some special servers.

A Dual Inline Memory Module comprises a predetermined number N of memory chips (DRAMs) on its printed circuit board. The data width of each memory chip is typically 4 bits, 8 bits or 16 bits. Nowadays personal computer mostly uses a unbuffered Dual Inline Memory Module if a DIMM is selected as the main memory. However, for a computer system with higher main memory volume requirements, in particular a server, registered Dual Inline Memory Modules are the popular choice.

Since memory requirements in a computer system are increasing day by day i.e. both in terms of memory size and memory speed it is desired to place a maximum number of memory chips (DRAMs) on each memory module (DIMM).

FIG. 1 shows a Dual Inline Memory Module according to the state of the art. The Dual Inline Memory Module comprises N DRAM chips mounted on the upper side of the printed circuit board (PCB). The registered Dual Inline Memory Module as shown in FIG. 1 comprises a command and address buffer which buffers command and address signals applied to the Dual Inline Memory Module by a main motherboard and which outputs these signals via a command and address bus (CA) to the DRAM chips mounted on the printed circuit board. A chip selection signal S is also buffered by the command and address buffer and is provided for selecting the desired DRAM chip mounted on the DIMM circuit board. All DRAM chips are clocked by a clock signal CLK which is buffered by a clock signal buffer which is also mounted on the Dual Inline Memory Module (DIMM). Each DRAM chip is connected to the motherboard by a separate databus (DQ) having q data lines. The data bus of each DRAM chip comprises typically 4 to 16 bits.

FIG. 2 shows a cross section of the Dual Inline Memory Module (DIMM) as shown in FIG. 1 along the line A-A'. To increase the memory capacity the DIMM has DRAM chips mounted on both sides of the printed circuit board (PCB). There is a DRAM chip on the top side of the DIMM module and a DRAM chip on the bottom side of the DIMM module. Accordingly the DRAM Dual Inline Memory Module as shown in FIG. 2 comprises two memory ranks or memory levels, i.e. memory rank 0 and memory rank 1.

To increase the memory capacity of a Dual Inline Memory Module (DIMM) further stacked DRAM chips have been developed.

FIG. 3 shows a stacked DRAM chip having an upper memory die and a lower memory die thus providing two memory ranks within one stacked DRAM chip. The two memory dies are packaged within one chip on a substrate. The stacked DRAM chip is connected to the printed circuit board via pads such as solder balls. Dual Inline Memory Modules which have stacked DRAM chips as shown in FIG. 3 on both sides of the printed circuit board have four memory ranks, i.e. two memory ranks on the top side and two memory ranks on the bottom side.

In current computer Dual Inline Memory Modules having two memory ranks are allowed. When increasing the number of memory ranks within the memory systems to four memory ranks or even eight memory ranks the load on the DQ bus and the CA bus as shown in FIG. 1 is increased. For the CA bus the increase of load is not dramatically since the command and address bus (CA) is running at half speed in comparison to the data bus and the command and address buffer redrives the address and command signals applied by the processor on the motherboard to the Dual Inline Memory Module. The increase of memory ranks on the Dual Inline Memory Module however causes an increase of the load of the DQ-data bus which is driven by the controller on the motherboard. The data rate on the DQ-busses is very high in particular when running at DDR-2 data rate. Consequently an increase of the load connected to each DQ data bus deteriorates rates the data signals further so that data errors can not be excluded. Accordingly there is a limitation of the number M of memory ranks within a DRAM chip connected to the DQ-bus of said chip. By limiting the number of memory ranks allowed within a DRAM chip the memory capacity of a Dual Inline Memory is also limited.

The conventional Dual Inline Memory Module as shown in FIG. 1 comprises a DRAM chip selection bus with CS selection lines. Further the Dual Inline Memory according to the state of the art as shown in FIG. 1 selects the memory ranks within each DRAM chip via a memory rank selection bus having S rank selection lines. The number of selection lines of the memory rank selection bus provided on the printed and circuit board of the Dual Inline Memory Module corresponds to the number M of memory ranks provided within each DRAM chip mounted on the printed circuit board. Further the number of signal pins for applying the memory rank selection signal corresponds to the number of memory ranks M within each DRAM chip. When the number M of memory ranks within each DRAM chip is increased the number of signal pins provided at the edge of the printed circuit board of the Dual Inline Memory Module increases proportionally. When for instance each DRAM chip comprises 8 memory ranks the number of signal pins for the memory rank selection is also 8. However the number of signal pins which can be provided at the edge of the dual inline memory module circuit board is limited.

SUMMARY OF THE INVENTION

Accordingly it is the object of the present invention to provide a memory rank decoder for a Multi-Rank Dual Inline Memory Module (DIMM) which allows an increased number (M) of memory ranks within the memory chips of dual inline memory with a minimum number of signal pins for connecting the dual inline memory module to a motherboard.

This object is achieved by a memory rank decoder having the features of claim 8.

The present invention provides a memory rank decoder for a Multi-Rank Dual Inline Memory Module (DIMM) having a predetermined number (N) of DRAM memory chips mounted on a printer circuit board (PCB), wherein each DRAM memory chip comprises a predetermined number (N) of stacked DRAM memory dies which are selectable by a memory rank select signal (r), wherein the memory rank decoder generates the memory rank select signal (r) in response to external select signals applied to the dual inline module (DIMM).

In a first embodiment the memory rank decoder (DEC) according to the present invention is integrated in a command and address buffer chip for buffering external command and address signals applied to the dual inline memory module (DIMM).

The advantage of the first embodiment is that only one memory rank decoder has to be provided for each dual inline memory module according to the present invention.

In a second embodiment of the memory rank decoder according to the present invention the memory rank decoder is integrated in each DRAM memory chip mounted on the dual inline memory module.

The second embodiment has the advantage that the number of memory rank selection signal lines between the command and address buffer chips and the DRAM chips mounted on the printed circuit board of the dual inline memory module is minimized. This saves area on the printed circuit board of the dual inline memory module. Further the routing of the signal lines provided on the printed circuit board is facilitated.

The invention further provides a dual inline memory module (DIMM) having a predetermined number (N) of DRAM memory chips mounted on a printed circuit board (PCB) wherein each DRAM memory chip comprises a predetermined number (M) of stacked DRAM memory dies which are selectable by a memory rank selection signal (r), wherein the memory rank selection signal (r) is generated by a memory rank decoder in response to external select signals applied to the Dual In Line Memory Module.

In a preferred embodiment of the dual inline memory module according to the present invention the dual inline memory module is a registered dual inline memory module having a command and address buffer chip for buffering external command and address signals applied to the dual inline memory module.

In a preferred embodiment the command and address buffer chip further buffers an external clock signal applied to the dual inline memory module.

In a preferred embodiment the command and address buffer chip is connected by a command and address bus to all DRAM memory chips mounted on the printed circuit board (PCB).

In a preferred embodiment the memory rank decoder according to the present invention is integrated in said command and address buffer chip.

In an alternative embodiment of the dual inline memory module according to the present invention each DRAM memory chip comprises an integrated memory rank decoder.

In a preferred embodiment the DRAM memory chips are mounted on both sides of the printed circuit board so that the number of memory ranks in said dual inline memory module is twice the number of stacked DRAM memory dies within each DRAM memory chip.

DETAILED DESCRIPTION OF THE INVENTION

Figure 1:
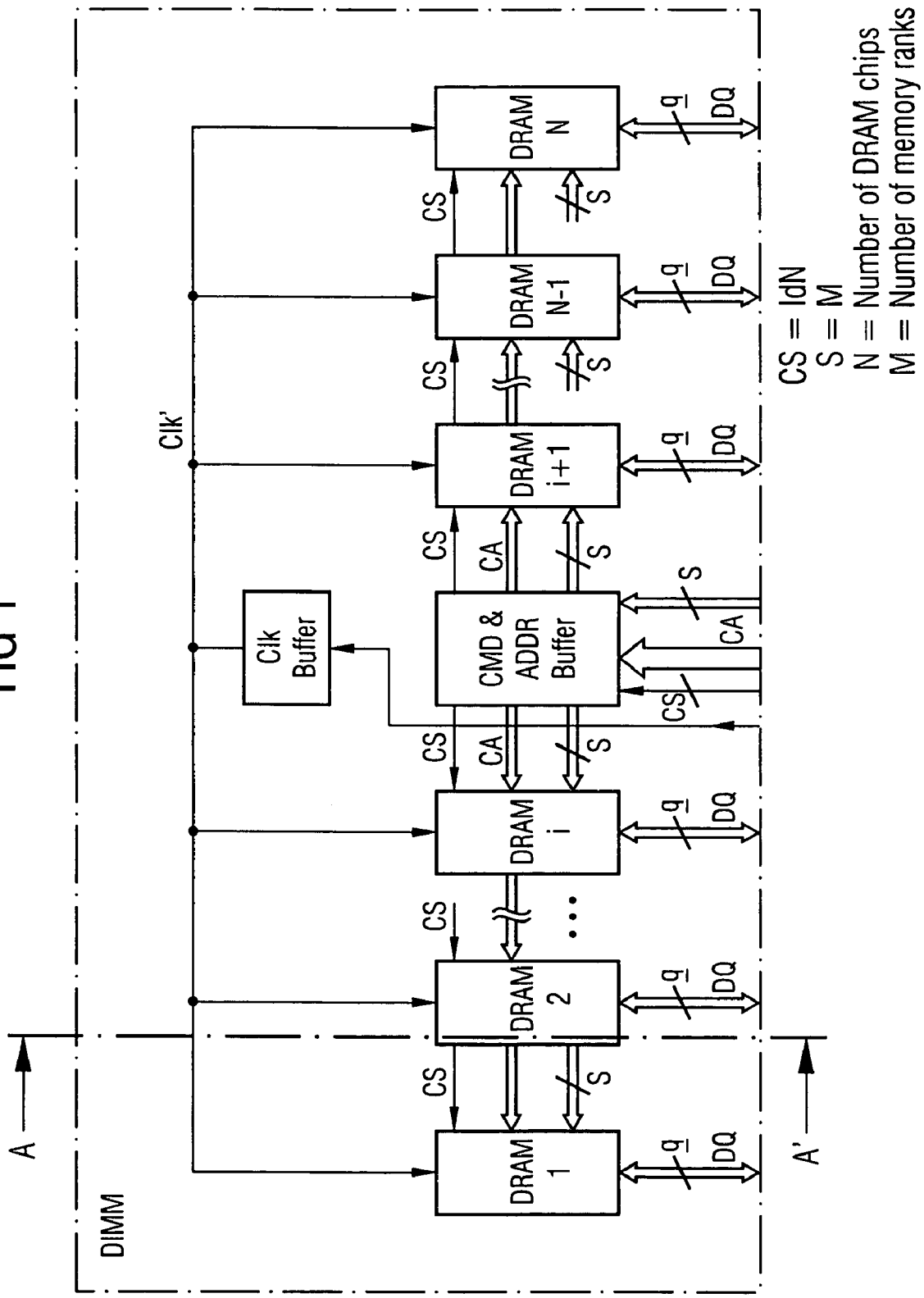
FIG. 1 shows a dual inline memory module according to the state of the art from above.
Figure 2:
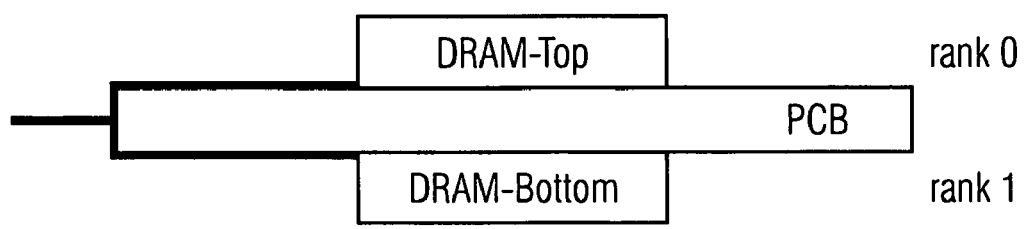
FIG. 2 is a cross section view of a dual inline memory module according to the state of the art as shown in FIG. 1.
Figure 3:
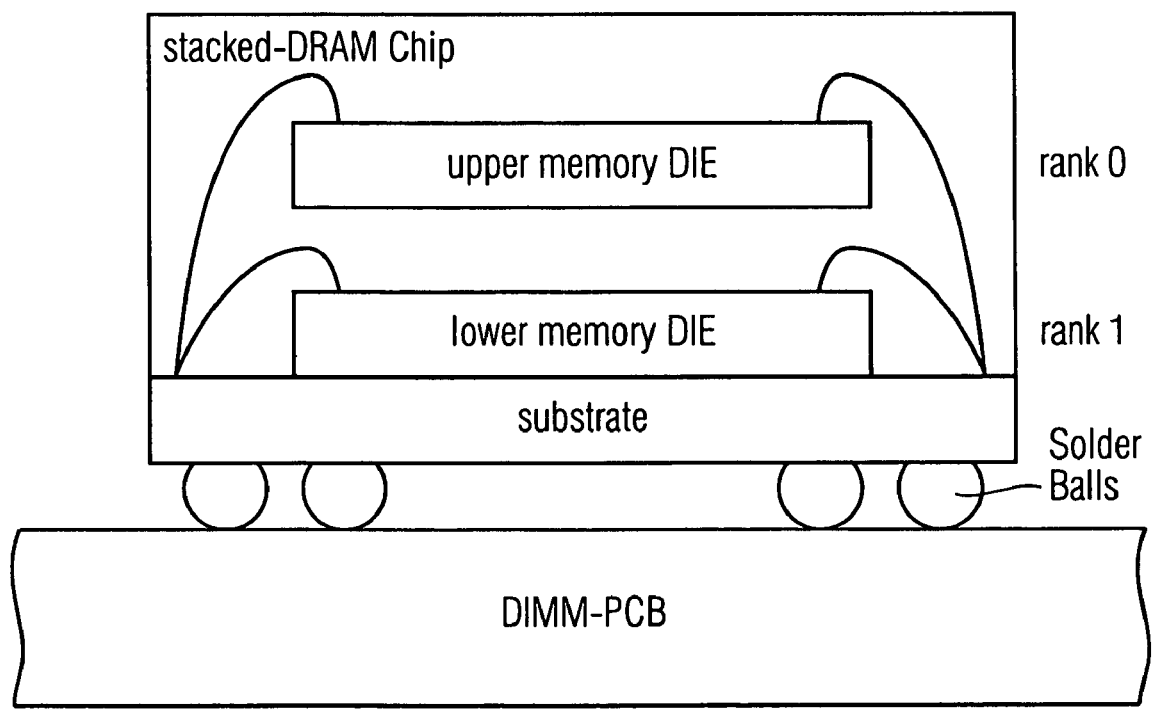
FIG. 3 shows a cross section of a stacked DRAM chip according to the state of the art.
Figure 4:
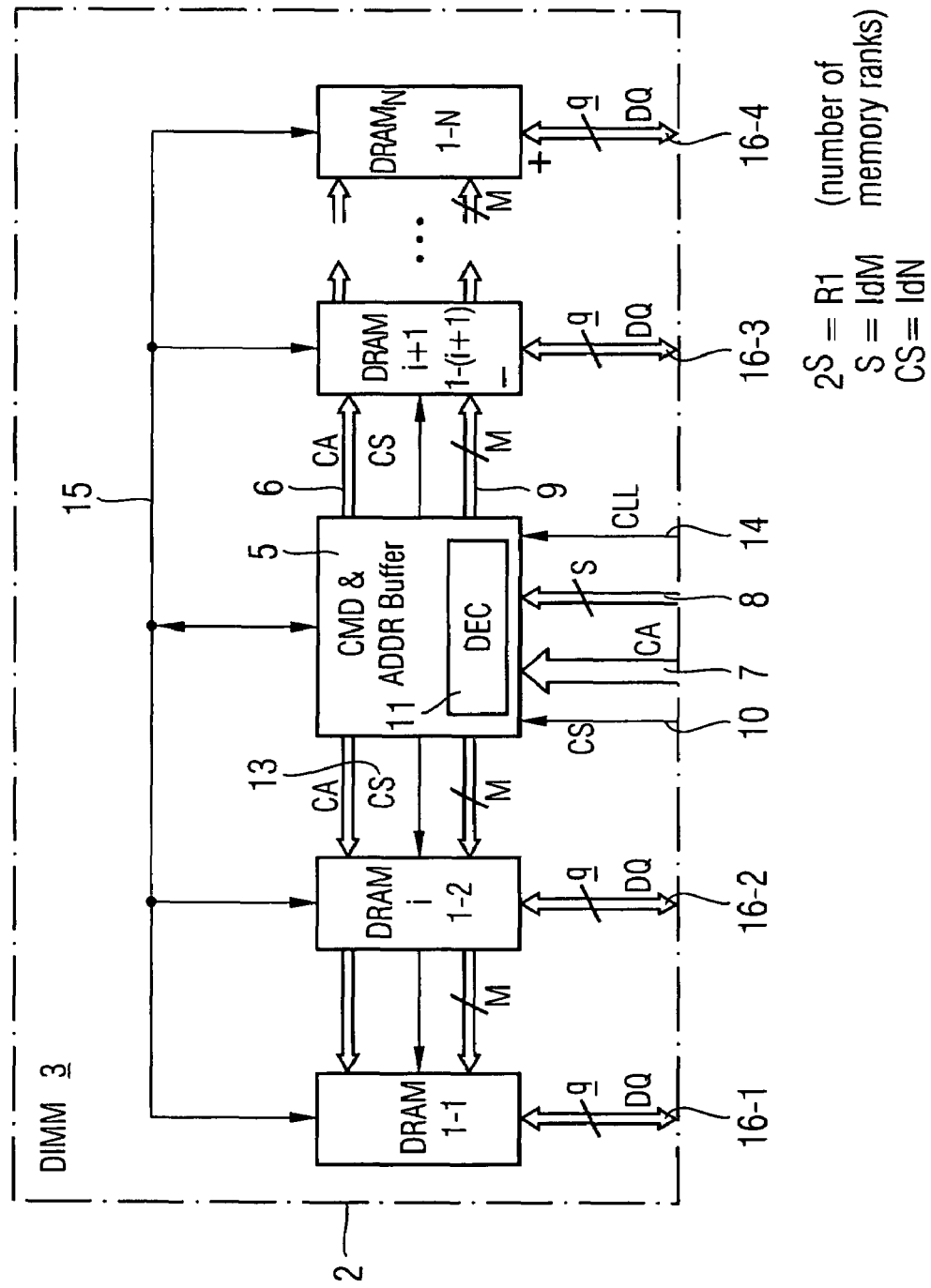
FIG. 4 shows a first embodiment of the dual inline memory module according to the present invention.

Referring to FIG. 4 it shows a first embodiment of a dual inline memory module according to the present invention. On the dual inline memory module 3 a predetermined number M of DRAM memory chips 1 are mounted on a printed circuit board 2 of the dual inline memory module 3. The DRAM memory chips 1 are stacked DRAM chips. Each DRAM chip 1 comprises a predetermined number M of stacked DRAM memory dies 4-$i$. Each memory die within the DRAM chip 1 is selectable by a corresponding memory rank selection signal. DRAM memory dies 4-$i$ include each an array of memory cells which are addressable by address lines.

The dual inline memory module 3 comprises at least one central command and address buffer chip 5 which is located in the middle of the printed circuit board 2 of the dual inline memory module 3. The command and address buffer chip 5 is connected via a command and address bus 6 to all DRAM memory chips 1 on the dual inline memory module 3. The command and address buffer 5 received command and address signals from the main circuit board via command and address lines 7 and drives then via the command and address bus 6 to all DRAM chips 1. The command and address buffer further receives memory rank selection signals via a selection control bus 8 and drives then via a selection bus 9 of the dual inline memory module 3 to all DRAM chips 1 mounted on the printed circuit board 2 of the dual inline memory 3.

The command and address buffer chip 5 further receives chip select signals CS via a control line 10 to select a DRAM chip 1 mounted on the dual inline memory circuit board 2.

In the first embodiment of the dual inline memory module 3 as shown in FIG. 4 the numbers of memory rank selection lines 8 between the command and address buffer chip 5 of the dual inline memory module 3 and the controller mounted on the motherboard depends from the number M of memory ranks within each DRAM chip 1:

S=ldM

The number CS of chip select control lines 10 depends on the number N of DRAM chips 1 mounted on the dual inline memory circuit board 2:

CS=ld N

The dual inline memory module 3 has a minimum number S of memory rank selection signals so that the number of corresponding signal pins on the edge of the printed circuit board 2 connecting the dual inline memory module 3 with the motherboard is minimized. This is achieved by a memory rank decoder 11 integrated within the command and address buffer chip 5 which receives the memory rank selection signal S via the control bus 8 and decodes this control signal to generate a memory rank selection signal which is forwarded to the DRAM memory chips 1 mounted on the printed circuit board 2 This decoded memory rank selection signal is applied to the DRAM memory chip 1 via a control bus 9 wherein the bus width of the control bus 9 corresponds to the number M of memory ranks within each DRAM chip 1.

The command and address buffer 11 buffers all command and adress signals and all selection signals received from the motherboard. The chip select control signal received via control lines 10 is applied to all DRAM chips 1 via control lines 13.

In a preferred embodiment the command and address buffer chip 5 further comprises a buffer for an external clock signal Clk applied to the dual inline memory module 3 from the motherboard. As can be seen from FIG. 4 the command and address buffer chip 5 receives via a clock line 14 an external clock signal from the motherboard and applies the clock signal via a clock line 15 to all DRAM memory chips 1 mounted on the dual inline memory module 3.

Each DRAM chip 1 exchanges data with the motherboard via a corresponding separate DQ-databus 16-$i$ comprising q data lines. The number q of data lines typical varies between 4 to 16 bits.

Figures 5A, 5B:
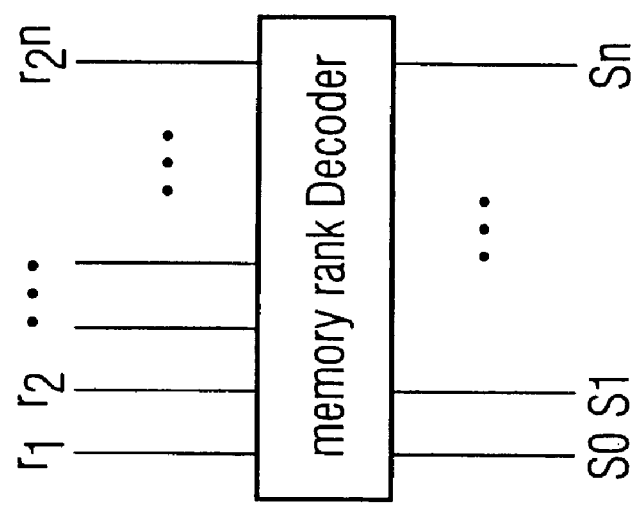
FIG. 5a shows a table for a preferred embodiment of the memory rank decoder according to the present invention.
FIG. 5b shows a simple block diagram of a memory rank decoder according to the present invention.

FIG. 5$a$ shows a table for a memory rank decoder 11 according to the present invention for a dual inline memory module 3 having M=8 memory ranks. The decoder 11 integrated within the command and address buffer 5 receives three memory rank selection signals S0, S1, S2 from the processor of the motherboard via the control bus 8. The received memory rank selection signal is decoded by the memory rank decoder 11 and applied to the DRAM memory chips 1 via control bus 9. For instance the memory selection control signal S (=0, 0, 0) selects the memory rank ø within all DRAM chips 1 mounted on the dual inline memory module 3. In this embodiment only three signal pins for applying the memory rank selection signal have to be provided on the dual inline memory circuitboard 2 for selecting 8 memory ranks within the DRAM chips 1.

Figure 6:
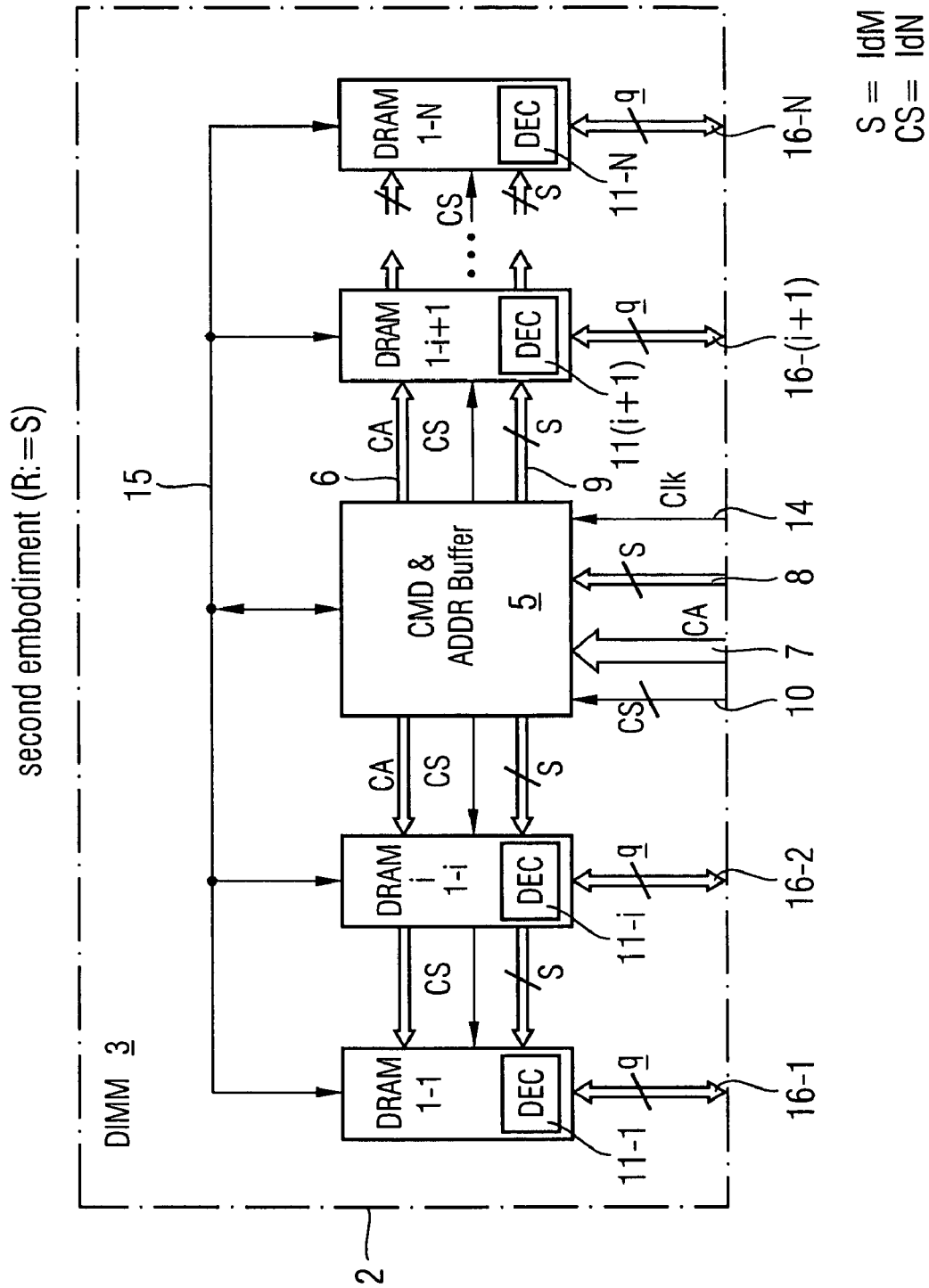
FIG. 6 shows a second embodiment of a dual inline memory module according to the present invention.

FIG. 6 shows a second embodiment of the dual inline memory module 3 according to the present invention. In this second embodiment the memory rank decoder 11 according to the present invention is integrated not in the command and address buffer chip 5 but in each DRAM memory chip 1-$i$. In this second embodiment the bus width of the control bus 9 is smaller than in the first embodiment. If the number M of the memory ranks provided the dual inline memory module 3 is for instance M=8 the number of memory rank selection signal lines of the control bus 9 is ld 8=3. This has the advantage that the area on the printed circuit board 3 is saved and the routing of the signal lines can be simplified.

Figure 7:
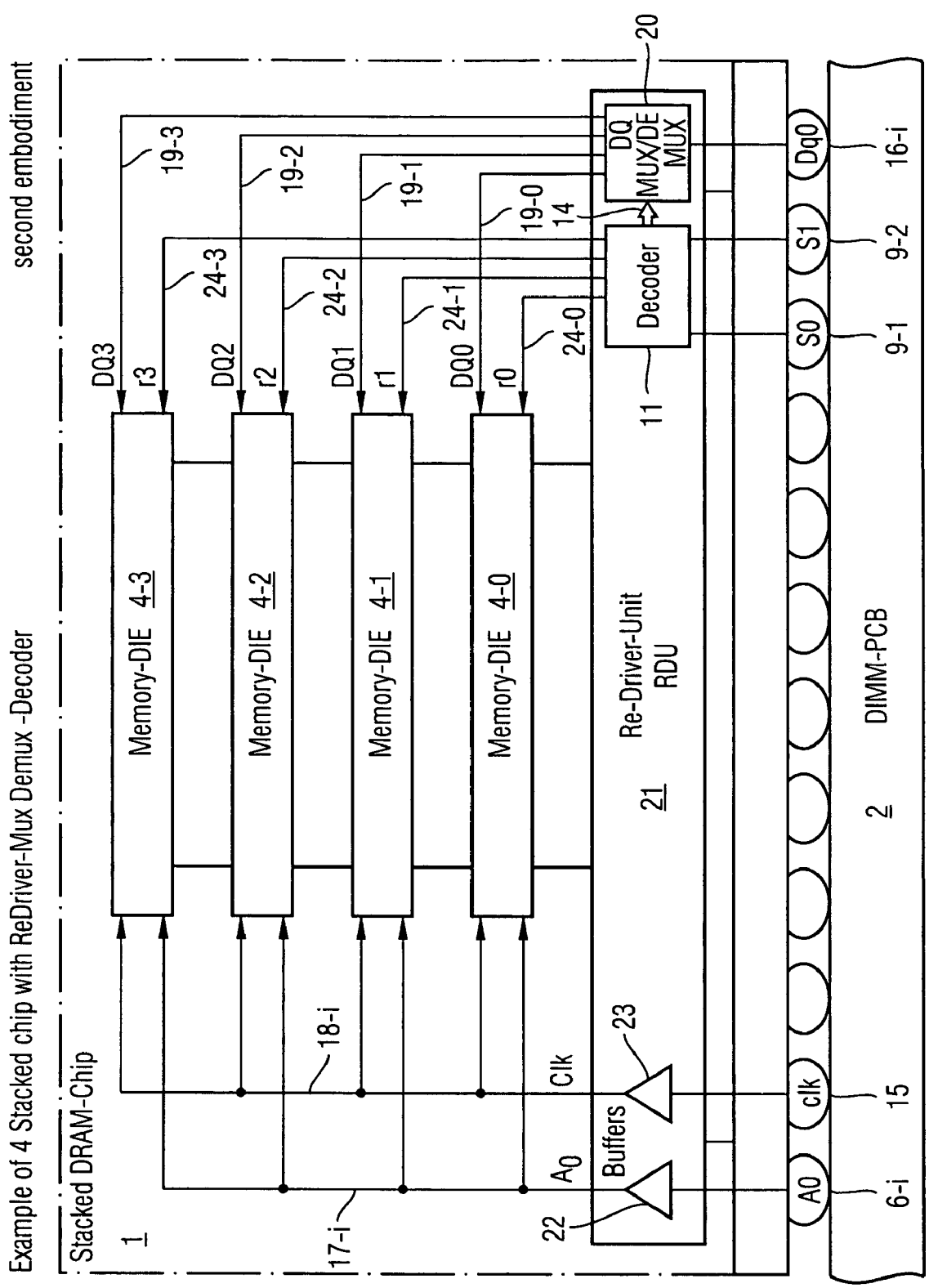
FIG. 7 shows a cross section of a stacked DRAM chip mounted on a dual inline memory module according to a second embodiment of the present invention.

FIG. 7 shows a cross section through a stacked DRAM chip 1 mounted on the dual inline memory module 3 according to the second embodiment as shown in FIG. 6. The stacked DRAM chip 1 as shown in FIG. 7 comprises in the shown embodiment four stacked DRAM memory dyes 4-0, 4-1, 4-2, 4-3. Each memory die 4-$i$ is selectable by a corresponding memory rank signal r-$i$. The DRAM memory dies 4-$i$ include each an array of memory cells which are addressable by address lines. A common internal address bus comprises a predetermined number of internal address lines 17-$i$ provided for addressing the memory cells of the memory dies 4-$i$.

FIG. 7 further shows as an example an address pad $A_0$ connected via a address line 17-$i$ to all memory dies 4-$i$. All address lines of the internal address bus are connected in parallel to all four DRAM memory dies of the stacked DRAM memory chip 1. The memory dies 4-$i$ are clocked by a clock signal CLK applied to all memory dies 4-$i$ via an internal clock line 18-$i$. The memory dies 4-$i$ each are connected via a corresponding internal data bus 19-$i$ to a DQ-multiplexer/demultiplexer 20. Each internal data bus 19-$i$ comprises a predetermined number of data lines for connecting the respective memory die 4-$i$ to the DQ-multiplexer/demultiplexer 20. Each DQ data bus 19-$i$ comprises for instance 4 to 16 bit lines. The internal data busses 19-$i$ are provided for writing data into the memory cells and for reading data out of the memory cells of the stacked DRAM memory dies 4-*i*.

The stacked DRAM chip 1 as shown in FIG. 7 comprises beneath the stacked DRAM memory dies 4-*i* a redriving unit 21. The redriving unit 21 includes a DQ-multiplexer/demultiplexer unit 20 and buffers 22 for all internal address signals applied to the address pads of said DRAM memory chip 1. Further a redriving unit 21 comprises a buffer 23 for driving a clock signal CLK applied to the DRAM chip 1 by means of the internal clock line 15. The memory rank decoder 11 according to the present invention is integrated in a preferred embodiment within the redriving unit 21 of the stacked DRAM memory chip 1. The memory rank decoder 11 generates the internal memory rank selection signal in response to the selected signals applied to control pads 9-1, 9-2 of the DRAM memory chip 1 as shown in FIG. 7. In the shown embodiment the memory rank decoder 11 receives two memory rank selection signals $S_0$, $S_1$, and decodes them to generate four memory rank selection signals $r_i$ which are applied to the memory dies 4-*i* via control lines 24-*i*.

What is claimed is:

1. Dual In Line Memory Module having a predetermined number of memory chips mounted on a printed circuit board wherein each memory chip comprises a predetermined number of stacked memory dies which are selectable by a memory rank selection signal, wherein the memory rank selection signal is generated by a memory rank decoder in response to external selection signals applied to the Dual In Line Memory Module, wherein the memory chips are selectable by memory chip select signals, and wherein the predetermined number of stacked memory dies is greater than the number of the external selection signals applied to the Dual In Line Memory Module.

2. Dual In Line Memory Module according to claim 1 wherein each memory chip comprises an integrated memory rank decoder.

3. Dual In Line Memory Module according to claim 1 wherein the memory chips are mounted on both sides of the printed circuit board so that the number of memory ranks of said Dual In Line Memory Module is twice the number of stacked memory dies within each memory chip.

4. Dual In Line Memory Module according to claim 1 wherein the Dual In Line Memory Module is a registered Dual In Line Memory Module having a command and address buffer chip for buffering external command and address signals applied to the Dual In Line Memory Module.

5. Dual In Line Memory Module according to claim 4 wherein the command and address buffer chip further buffers an external clock signal applied to the Dual In Line Memory Module.

6. Dual In Line Memory Module according to claim 4 wherein the command and address buffer chip is connected by a command and address bus to all memory chips mounted on the printed circuit board.

7. Dual In Line Memory Module according to claim 4 wherein the memory rank decoder is integrated in said command and address buffer chip.

8. Memory Rank Decoder for a Multi-Rank Dual Inline Memory Module having a predetermined number of memory chips mounted on a printed circuit board, wherein each memory chip comprises a predetermined number of stacked memory dies which are selectable by a memory rank selection signal, wherein the memory rank decoder generates the memory rank selection signal in response to external selection signals applied to the dual inline module, wherein the memory chips are selectable by memory chip select signals, and wherein the predetermined number of stacked memory dies is greater than the number of the external selection signals applied to the Dual In Line Memory Module.

9. Memory Rank Decoder according to claim 8, wherein the Memory Rank Decoder is integrated in a command and address buffer chip which is provided for buffering external command and address signals applied to the dual inline memory module.

10. Memory Rank Decoder according to claim 8, wherein the Memory Rank Decoder is integrated in each memory chip of the dual inline memory module.

11. Memory Rank Decoder according to claim 8, wherein the memory chip is a DRAM memory chip.

* * * * *